US009647617B2

(12) United States Patent
Buono et al.

(10) Patent No.: US 9,647,617 B2
(45) Date of Patent: May 9, 2017

(54) METHOD FOR DELIVERING A DUTY CYCLE LIMITED SIGNAL TO A SPEAKER USING A CLASS D AMPLIFIER

(71) Applicant: Crestron Electronics, Inc., Rockleigh, NJ (US)

(72) Inventors: Robert Buono, Ringwood, NJ (US); Dennis Fink, Warwick, NY (US)

(*) Notice: Subject to any disclaimer, the term of this patent is extended or adjusted under 35 U.S.C. 154(b) by 0 days.

(21) Appl. No.: 15/346,111

(22) Filed: Nov. 8, 2016

(65) Prior Publication Data

US 2017/0054421 A1 Feb. 23, 2017

Related U.S. Application Data

(62) Division of application No. 14/328,451, filed on Jul. 10, 2014, now Pat. No. 9,509,261.

(51) Int. Cl.
| | |
|---|---|
| H03F 99/00 | (2009.01) |
| H04R 3/00 | (2006.01) |
| H03F 3/217 | (2006.01) |
| H03F 3/185 | (2006.01) |
| H03F 3/68 | (2006.01) |
| H03F 3/183 | (2006.01) |

(Continued)

(52) U.S. Cl.
CPC ............. *H03F 3/217* (2013.01); *H03F 3/183* (2013.01); *H03F 3/185* (2013.01); *H03F 3/2171* (2013.01); *H03F 3/2173* (2013.01); *H03F 3/68* (2013.01); *H04R 3/04* (2013.01); *H04R 3/12* (2013.01); *H03F 2200/03* (2013.01); *H03F 2200/171* (2013.01); *H03F 2200/351* (2013.01); *H03F 2200/78* (2013.01)

(58) Field of Classification Search
CPC ........ H03F 3/2173; H03F 3/217; H03F 3/211; H03F 3/38; H03F 2200/03; H03F 2200/351; H03F 3/68; H03F 3/183; H03F 3/185; H03F 2200/78; H03F 2200/171; H04R 3/00; H04R 3/002; H04R 5/04; H04R 2203/00; H04R 2430/00
See application file for complete search history.

(56) References Cited

U.S. PATENT DOCUMENTS

| | | | | |
|---|---|---|---|---|
| 2002/0167354 | A1* | 11/2002 | Stanley | ................. H03F 3/2175 330/10 |
| 2003/0095000 | A1* | 5/2003 | Ramage | ................. H03F 1/3205 330/10 |

(Continued)

OTHER PUBLICATIONS

Jan. 27, 2017 U.S. Appl. No. 15/345,793 Office Action.

(Continued)

*Primary Examiner* — Thang Tran
(74) *Attorney, Agent, or Firm* — Creston Electronics Inc.

(57) ABSTRACT

A multi-channel Class D audio amplifier is provided to substantially reduce channel-to-channel crosstalk by employing in each channel a local triangle ramp generator controlled by a single global digital timing signal. The noise critical timing/integrating capacitor for the triangle ramp generator resides locally in each channel and adjacent to the PWM comparator of that channel and referenced to the local ground of that channel. The amplifier can also include a duty cycle limitation circuit to limit output power availability depending on the impedance of any attached loads (speakers).

7 Claims, 9 Drawing Sheets

(51) Int. Cl.
H04R 3/04 (2006.01)
H04R 3/12 (2006.01)

(56) References Cited

U.S. PATENT DOCUMENTS

| | | | | |
|---|---|---|---|---|
| 2006/0012428 A1* | 1/2006 | Ohkuri | ............... | H03F 3/217 |
| | | | | 330/251 |
| 2008/0278209 A1* | 11/2008 | Kim | ............... | H03F 3/2175 |
| | | | | 327/175 |
| 2008/0278230 A1* | 11/2008 | Kost | ............... | H03F 1/30 |
| | | | | 330/10 |
| 2010/0315163 A1* | 12/2010 | Takagi | ............... | H03F 3/217 |
| | | | | 330/207 A |
| 2012/0045076 A1* | 2/2012 | Gonano | ............... | H03F 3/217 |
| | | | | 381/120 |
| 2015/0071464 A1* | 3/2015 | Du | ............... | H04R 3/002 |
| | | | | 381/94.5 |
| 2015/0077082 A1* | 3/2015 | Kilic | ............... | H02M 1/32 |
| | | | | 323/284 |

OTHER PUBLICATIONS

Jan. 27, 2017 U.S. Appl. No. 15/345,834 Quayle Action.
Feb. 24, 2017 U.S. Appl. No. 15/345,885 Office Action.
Mar. 17, 2017 Resp Quayle Office Action.
Mar. 31, 2017 Resp to Office Action.

* cited by examiner

METHOD FOR DELIVERING A DUTY CYCLE LIMITED SIGNAL TO A SPEAKER USING A CLASS D AMPLIFIER

PRIORITY INFORMATION

The present application claims priority as a divisional patent application under 35 U.S.C. §121 to U.S. Non-Provisional patent application Ser. No. 14/328,451, filed 10 Jul. 2014, the entire contents of which are expressly incorporated herein by reference, and to U.S. Provisional Patent Application Ser. No. 61/910,801, filed 2 Dec. 2013, the entire contents of which are expressly incorporated herein by reference.

CROSS REFERENCE TO RELATED APPLICATIONS

Related subject matter is disclosed in co-pending U.S. Non-Provisional patent application Ser. Nos. 15/345,793, 15/345,834, and 15/345,885, each of which were co-filed on 8 Nov. 2016, the entire contents of each of which are expressly incorporated herein by reference.

BACKGROUND OF THE INVENTION

Technical Field

The present invention relates generally to audio amplification. More particularly, the invention relates to devices, systems and methods for multi-channel amplification in class D amplifiers.

Background Art

Typically one of the last components in an audio distribution chain, audio amplifiers amplify a low power audio signal to a level suitable for driving one or more loudspeakers. Multi-channel audio amplifiers are employed throughout structures to amplify more than one channel of audio.

As known to those of skill in the art, typical Class D amplifiers are a class of amplifier in which the audio signal modulates a pulse width modulated carrier signal to drive the output. Referring now to FIG. 1, a block diagram of class-D amplifier 100 is illustrated showing the different stages of operation of the amplifier. Input audio signal (input signal) 102 is input to pulse width modulator (PWM) comparator 104, which is part of modulator block 109, along with triangle wave 105 that has been generated by triangle wave generator 103. In PWM comparator 104, input signal 102 is compared to triangle wave 105. Triangle wave (or sawtooth wave) 105 is typically a much higher frequency signal than input signal 102—usually ten or more times the highest expected frequency of input signal 102. Thus, if an audio signal of about 20 Hz to about 20 kHz is expected as input signal 102, then triangle wave 102 should be at least about 200 kHz. As its name implies, PWM comparator 104 typically includes a comparator, and compares the amplitudes of input signal 102 to that of triangle wave 105 to form a pulse width modulated output. That is, the width of each pulse will be dependent upon the amplitude of both input signal 102 and the amplitude of triangle wave 105, but at a frequency equal to that of triangle wave 105. The duty cycle is proportional to the amplitude of input signal 102. If both input signal 102 and triangle wave 105 are centered about 0 volts, then for a 0 volt input signal 102, the output duty cycle is about 50%, and if input signal 102 is about $V_{tmax}$, the maximum of triangle waveform 105, the duty cycle is about 100%. If input signal 102 is about $V_{tmin}$, the lowest voltage value of triangle waveform 105, then the duty cycle is about 0%. FIG. 2 illustrates an example of a typical pulse width waveform generated in the above-described manner.

Referring now to FIG. 2, input signal 102 is shown as a roughly sinusoidal shaped signal with a frequency of about $1/20^{th}$ of that of triangle waveform 105. Comparator stage output 106 is shown below input signal 102 that is superimposed over triangle waveform 105; the logic level "high" represents the times in which input signal 102 exceeds that of triangle waveform 105. It can be seen that at points A and B, the duty cycle of comparator stage output 106 (the pulse width modulated signal) about 50%, and as input signal 102 swings closer to $V_{tmax}$ (at point C) and $V_{tmin}$ (at point D), the duty cycle of comparator stage output 106 changes from about 100% to about 0%, respectively.

As known by those of skill in the art, typical class D amplifiers with multiple channels typically comprise a global triangle ramp generator for use in all of the channels. A global analog buffer and a local analog buffer can be inserted between each channel and the triangle ramp generator.

Following PWM comparator 104, comparator stage output 106 is input to switching output stage (or power stage) 108, which is also part of modulation block 109. This device is typically comprised of an arrangement of switching transistors configured as a "half-bridge" or "full-bridge" and it amplifies the signal input to it, to create switching output signal 110. As can be seen in FIG. 1, switching output signal 110 is an amplified version of comparator stage output 106, and switches between only two states, the positive and negative power supply rail voltages (in the case of the "half-bridge" implementation), and the positive power supply rail voltage and ground (in the case of the "full-bridge" implementation). As known to those of skill in the art, the gain of the typical Class D amplifier modulator stage is set by the ratio of the power supply voltage, (or at least the power supply voltage that is available at switching output stage 108) and the peak-to-peak triangular wave voltage (triangle waveform 105). For example, the gain of the modulator stage, of a half-bridge implementation with +/−50 VDC power supply rails, and a triangular wave voltage of 10 Vpp is 100V/10V=10.

Following switching output stage 108 is filter stage 112. In filtering stage 112, the amplified PWM signal is passed through an (ideally) lossless low pass filter prior to the output device, speaker 116. The low pass filter removes the high frequency components of the PWM signal (switching output signal 110) and recovers the original audio signal, but in an amplified form, now referred to as amplified output signal 114.

Having briefly reviewed operation of a Class D amplifier in a fairly general sense, attention can now be directed to specific design issues with regard to Class D amplifiers. As those of skill in the art can appreciate, there are a multitude of design issues that need to be carefully considered with each new design of a Class D amplifier. Two such design considerations shall be considered herein. The first is isolation between channels, and the second is the safe operation over different load impedances.

Isolation between channels is a critical design consideration for multi-channel audio amplifiers. This isolation is typically expressed in decibels (dB) at a specific frequency, and further is typically a fairly small signal, thus a negative dB rating is typical, as the crosstalk signal is almost always much less than the original signal. Poor channel-to-channel isolation results in the audio signals from one channel being heard in another channel, which can result in poor channel separation. In a typical audio system, crosstalk can be audibly heard when volume levels are low (if there is a cross talk problem, which is not always the case). Notwithstanding its noticeability only when at low audio volumes, crosstalk, as mentioned above, can negatively affect channel separation, which could become more noticeable even at normal volume levels. Accordingly, high isolation (i.e. higher −dB crosstalk ratings) is desirable in multi-channel amplifiers.

One conventional solution to reduce channel-to-channel crosstalk includes the careful design of the printed circuit board (PCB) layout. Grounding may be used to eliminate common-impedance traces and mixing of signal and/or ground currents from more than one channel. Another scheme employed in conventional Class D amplifiers is differential signal routing instead of routing single-ended signals with a ground potential that is common to all channels. However, whenever a power, ground, or signal is common to more than one channel, it becomes a potential conveyer of crosstalk.

There are certain problems, however, with many of the conventional solutions to reduce crosstalk described above. Accordingly, it would be desirable to provide methods, modes and systems for reducing crosstalk and its effects in multi-channel Class D audio amplifiers.

The second design consideration to be considered herein is safe operation of a Class D amplifier over different load impedances. In Class D amplifiers, as known to those of skill in the art, the power conversion efficiency of the amplifier is only slightly degraded as DC rail voltages are increased. This decrease in efficiency is attributable to increased switching losses. In contrast, however, on-state losses actually decrease as the DC rail voltages rise (due to reduction in MOSFET ON-TIME (duty-cycle). Thus, the Class-D topology already provides more freedom in the selection of DC rail voltages to power the half-bridge or full-bridge stage (i.e., switching output stage 108). An additional important effect in selecting DC rail voltages is that the audio output signal will be able to span the entire peak-to-peak range defined by the DC rail voltage presuming a full duty cycle range from 0% to 100%. Therefore, as those of skill in the art can appreciate, increasing the DC rails will allow greater output voltage, current, and power (for a given load impedance).

There are applications where it would be advantageous to set or adjust the DC rail voltages to different voltages in order to tailor the available output voltage, current, or power, to a particular load impedance. Further, it has been alleged to be advantageous to be able to change these DC rail voltages substantially continuously or instantaneously. The dynamic ability to modulate the DC rail voltages, at either audio frequency rates, or static levels set by manual switches, has been attempted by other, conventional systems. At least one disadvantage of this prior art method is increased complexity in power supply design, and the additional complexity in the means to modulate the power supply output voltage(s). Another disadvantage to this approach, is that the modulator gain of the Class-D amplifier is directly affected by the magnitude of the DC rails, as previously discussed, and therefore the open-loop gain of the Class-D amplifier channel is directly affected by the magnitude of the DC rails. This can cause instability in the negative feedback loop compensation of the amplifier, as will be discussed further below.

Accordingly, it would be desirable to provide methods, modes and systems for enabling a Class D amplifier to be connected to different load impedances without having to change or vary the power supply voltage to provide safer operation.

SUMMARY OF THE INVENTION

It is to be understood that both the general and detailed descriptions that follow are exemplary and explanatory only and are not restrictive of the different aspects of the embodiments.

Disclosure of Invention

An object of the embodiments is to substantially solve at least the problems and/or disadvantages discussed above, and to provide at least one or more of the advantages described below.

It is therefore a general aspect of the embodiments to provide a Class D amplifier that will obviate or minimize problems of the type previously described.

According to a first aspect of the embodiments, a method for reducing crosstalk between channels in a fixed frequency class d amplifier is provided, the method comprising (a) receiving at least two channels of audio at the fixed frequency class d amplifier, (b) receiving a digital timing signal at at least two local ramp generators, (c) generating at least two local triangle waves based on the received digital timing signal, wherein, each of said two local triangle waves are generated such that noise that can exist on the digital timing signal that generated the respective local triangle wave is isolated from the respective local triangle wave by at least one of two diodes configured to provide such isolation for at least one of a positive voltage portion of the digital timing signal and a negative voltage portion of the digital timing signal, and (d) generating a pulse width modulated signal by comparing each of the at least two channels of audio to a local triangle wave.

According to a second aspect of the embodiments, a method for reducing crosstalk between channels in a fixed frequency class d amplifier is provided, the method comprising (a) receiving at least two channels of audio at the fixed frequency class d amplifier, (b) receiving a digital timing signal at at least two local ramp generators, (c) generating at least two local triangle waves based on the received digital timing signal, wherein, each of said two local triangle waves are generated such that a positive going portion of the triangle wave and a negative going portion of the triangle wave are kept substantially equal in duration, amplitude, and slope, by a DC servo circuit configured to monitor a first DC voltage on said triangle wave, and provide a second, oppositely polarized DC voltage to counteract the first DC voltage on said triangle wave, and (d) generating a pulse width modulated signal by comparing each of the at least two channels of audio to a local triangle wave.

According to a third aspect of the embodiments, a method for delivering a duty cycle limited signal to a speaker load in a Class D amplifier using a half-bridge switching output stage is provided, the method comprising (a) receiving an analog audio signal, (b) generating a triangle waveform, (c) comparing the triangle waveform to the received analog signal to generate a pulse width modulated signal, (d) measuring a load impedance (LI) of the speaker load, and (e) determining whether a power output (PO) rating of the Class D amplifier matches that of the load impedance, and if the PO rating matches the load impedance, amplifying the pulse width modulated signal, filtering the amplified pulse width modulated signal, and outputting the filtered, amplified pulse width modulated signal to the speaker load, and if the power output rating does not match the load impedance, calculating a duty cycle limitation t that limits the peak output voltage to the load impedance such that a new power output rating of the output signal matches the load impedance, and limiting the duty cycle of the PWM signal according to the calculated duty cycle limitation t.

According to the third aspect of the embodiments, the step of measuring a load impedance of the speaker load comprises using an impedance sensing device to measure the load impedance by measuring an output current to the speaker load, and measuring the output voltage to the speaker load, and calculating the load impedance based on the ratio of measured voltage to measured current. According to the third aspect of the embodiments, the step of calculating a duty cycle limitation t comprises calculating an appropriate output root mean square (RMS) voltage to be output to the load impedance according to the equation VRMS=SQRT(PO×LI), calculating a peak output voltage according to the equation VOUT-Peak=VRMS×1.414, and calculating the duty cycle t to limit the peak output voltage output to the load impedance according to the equation $V_{Peak}=(t \times V_{cc})+(t \times V_{ee})$, wherein $V_{cc}$ equals a positive rail voltage on a half-bridge switching stage that is part of the Class D amplifier, and $V_{ee}$ equals a negative rail voltage on the half-bridge switching stage.

According to the third aspect of the embodiments, the method further comprises filtering the duty cycle limited PWM signal, and outputting the filtered, duty cycle limited PWM signal to the speaker load.

BRIEF DESCRIPTION OF DRAWINGS

The accompanying figures further illustrate the aspects of the embodiments.

The components in the drawings are not necessarily drawn to scale, emphasis instead being placed upon clearly illustrating the principles of the present invention. In the drawings, like reference numerals designate corresponding parts throughout the several views.

BRIEF DESCRIPTION OF THE SEVERAL VIEWS OF THE DRAWING

Figure 1:
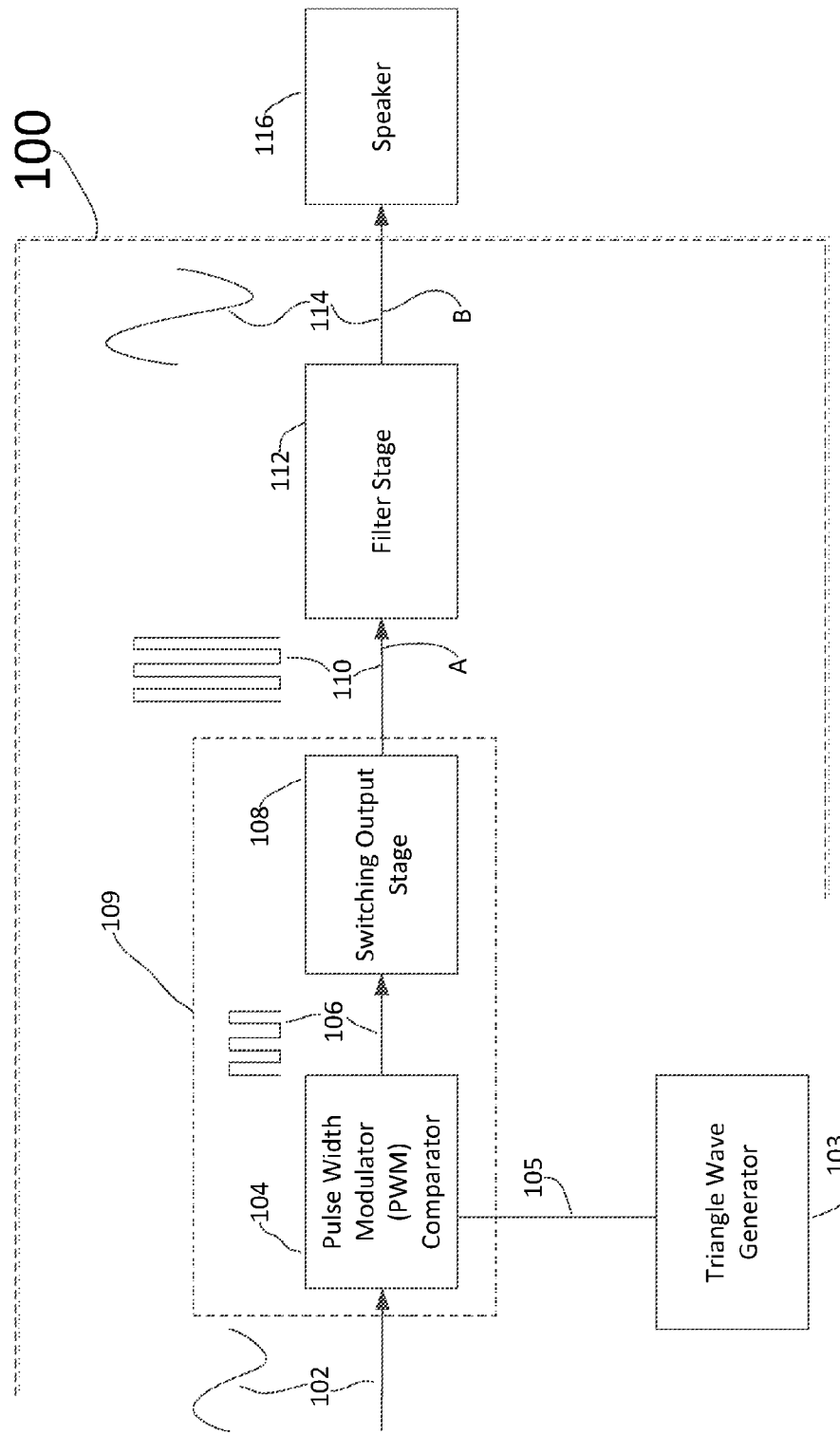

FIG. 1 is a block diagram of a Class D amplifier.

Figure 2:
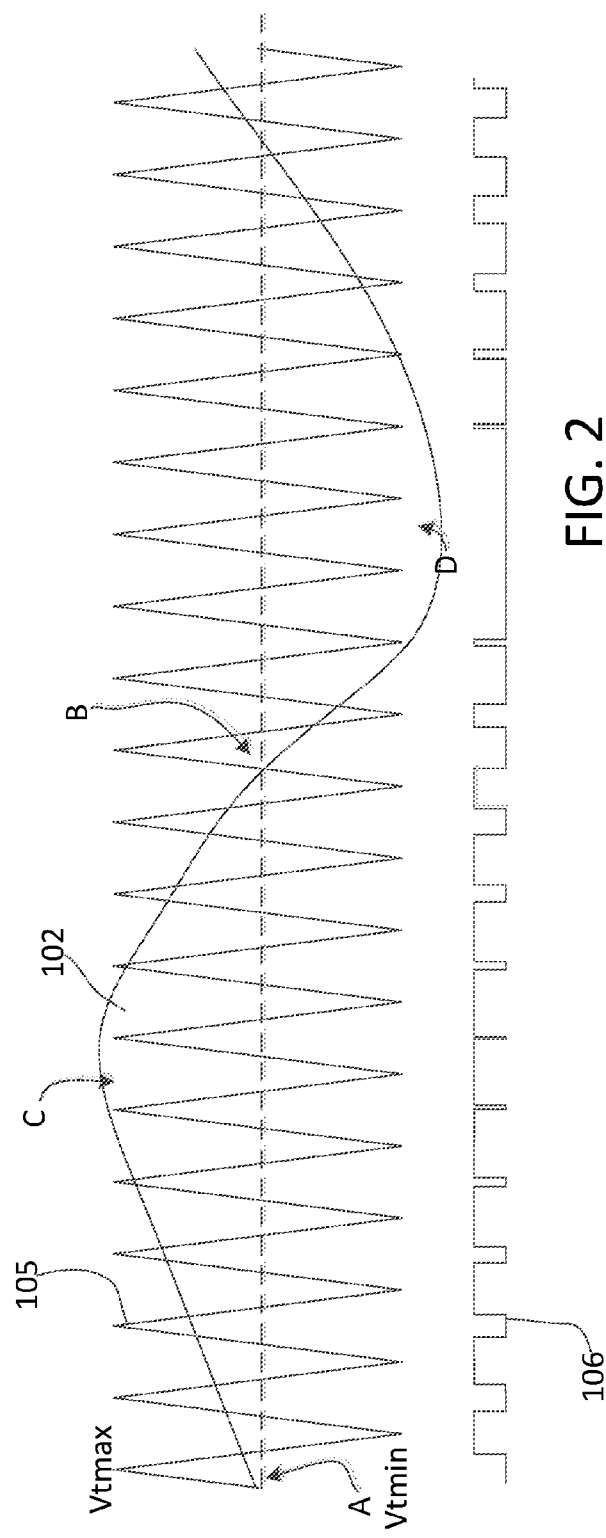

FIG. 2 illustrates a timing diagram of a triangle wave with an audio wave superimposed over it as inputs to a Class D amplifier modulator, and a resultant output therefrom.

Figure 3:
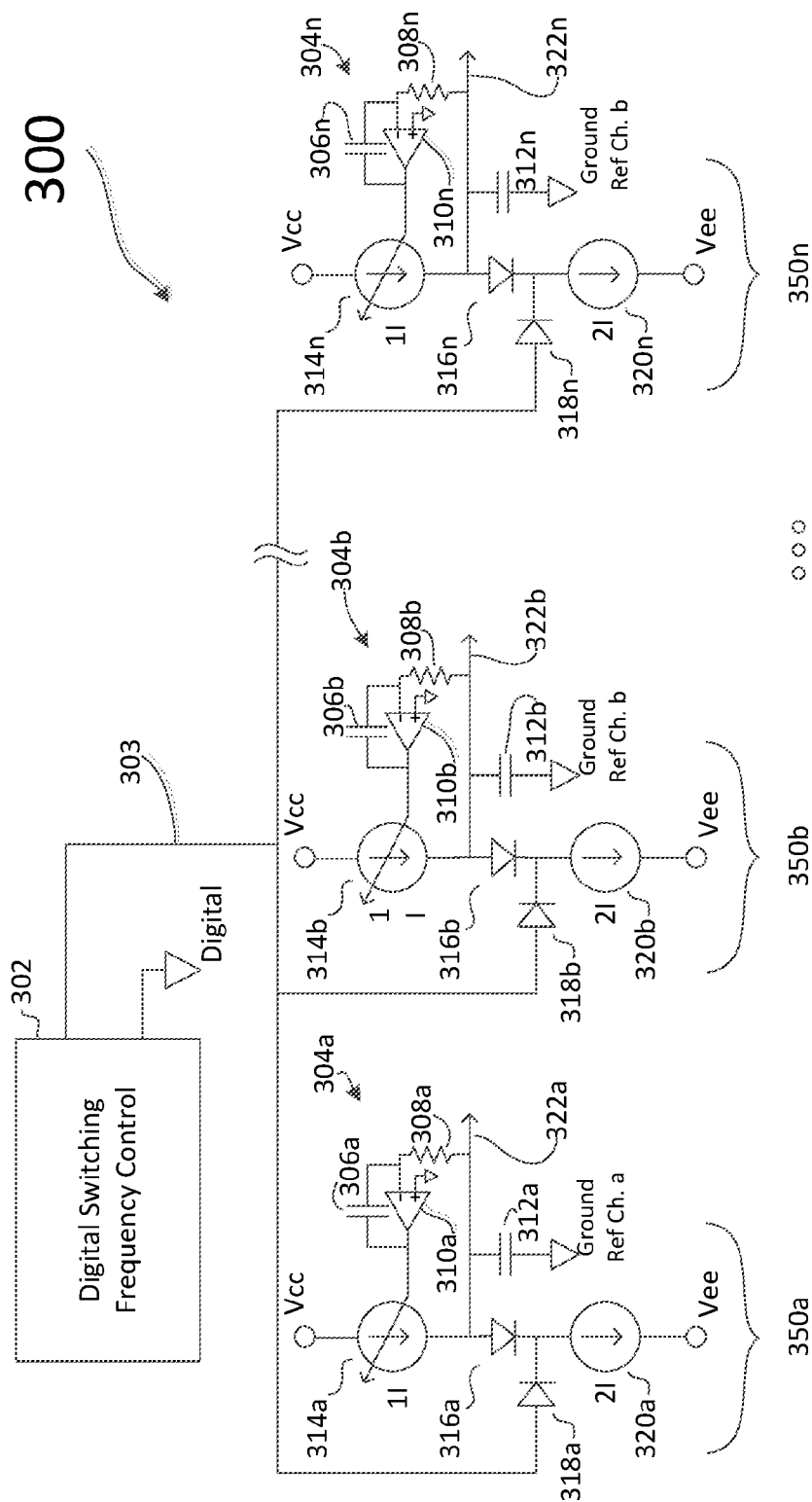

FIG. 3 is a schematic diagram of a portion of a multi-channel audio amplifier according to aspects of the embodiments.

Figure 4:
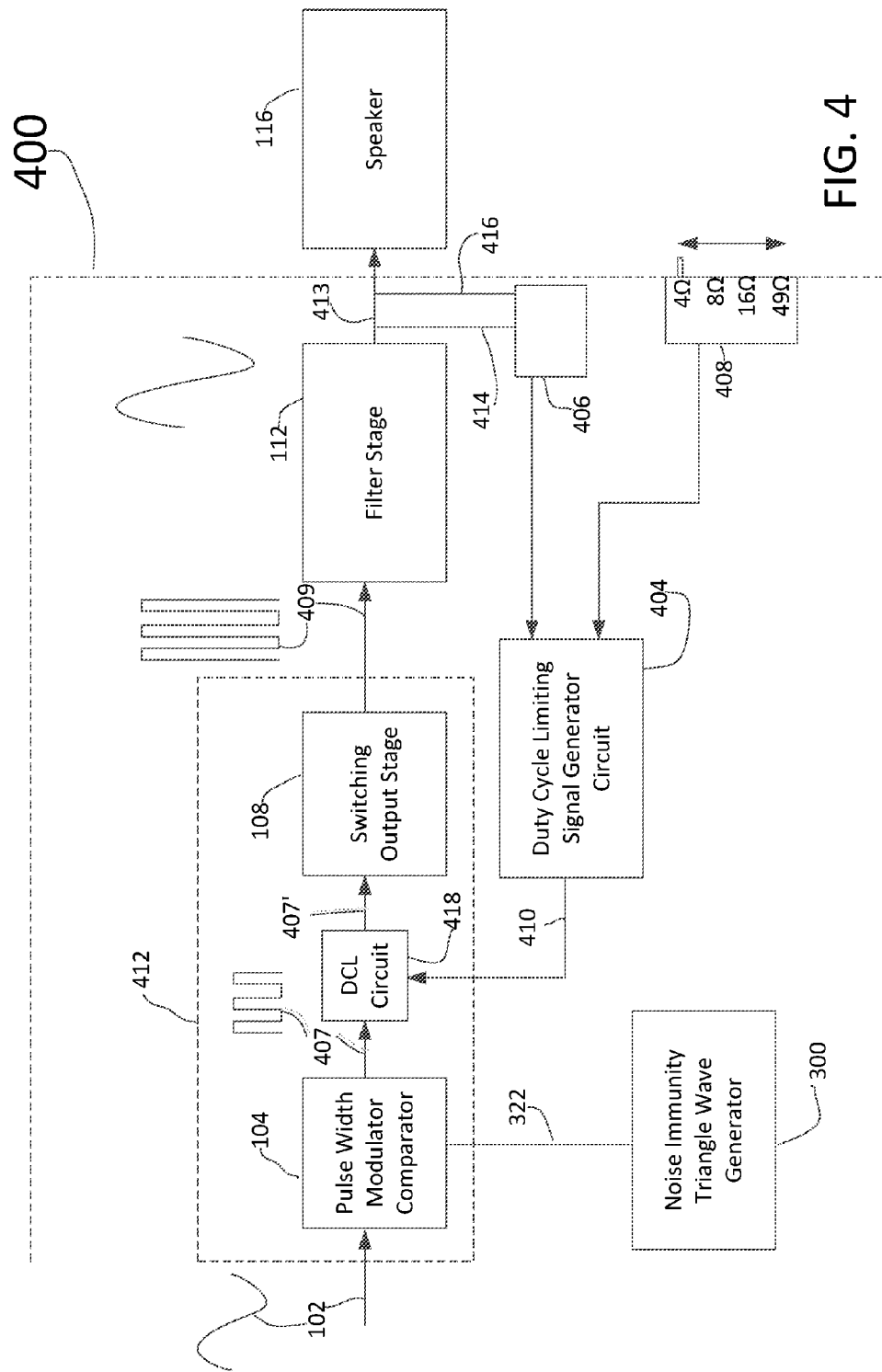

FIG. 4 is a block diagram of an advanced Class D amplifier according to aspects of the embodiments.

Figure 5:
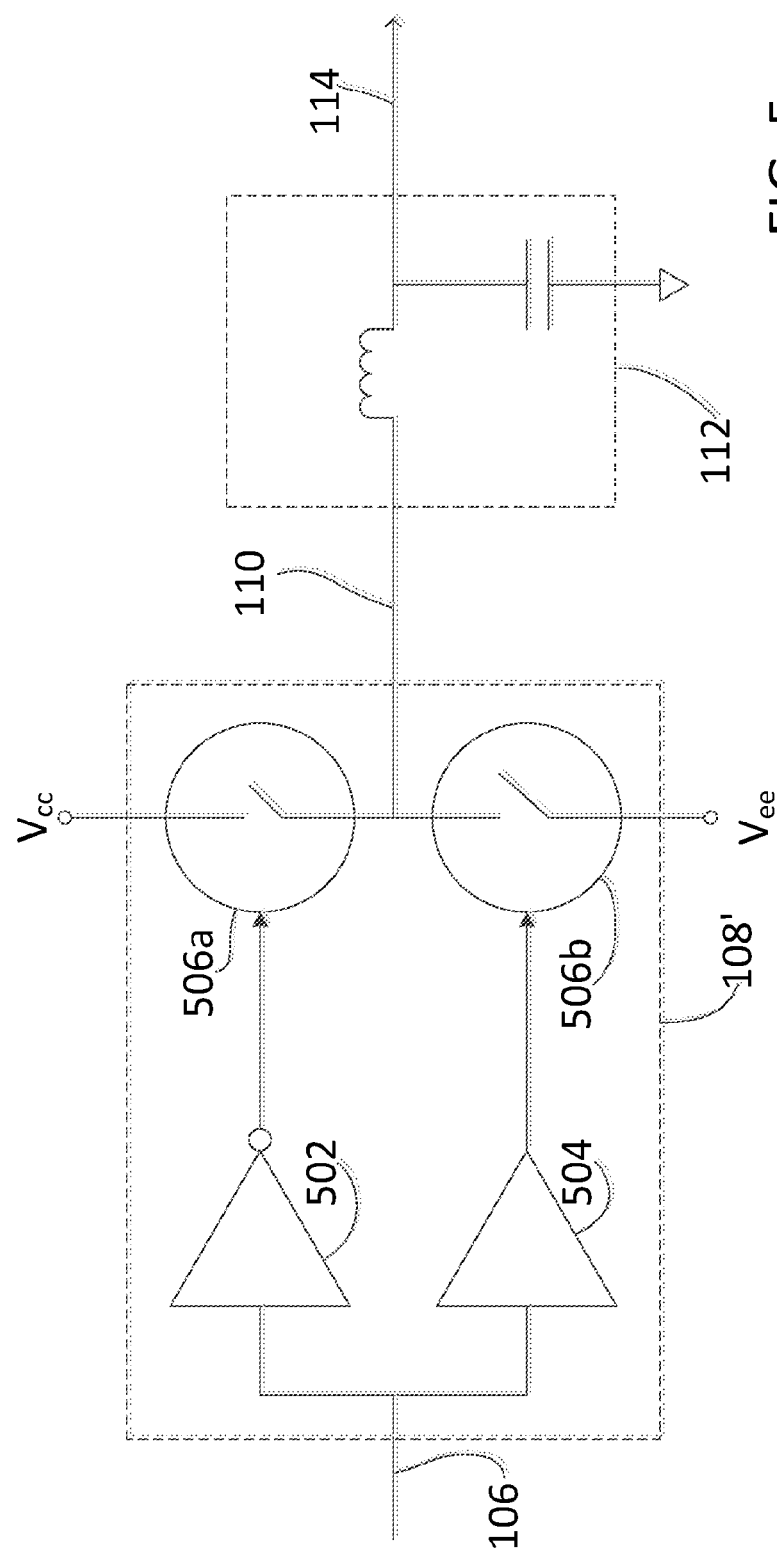

FIG. 5 is a schematic block diagram of switching output stage and output filter using a half-bridge transistor switching apparatus according to an embodiment.

Figure 6:
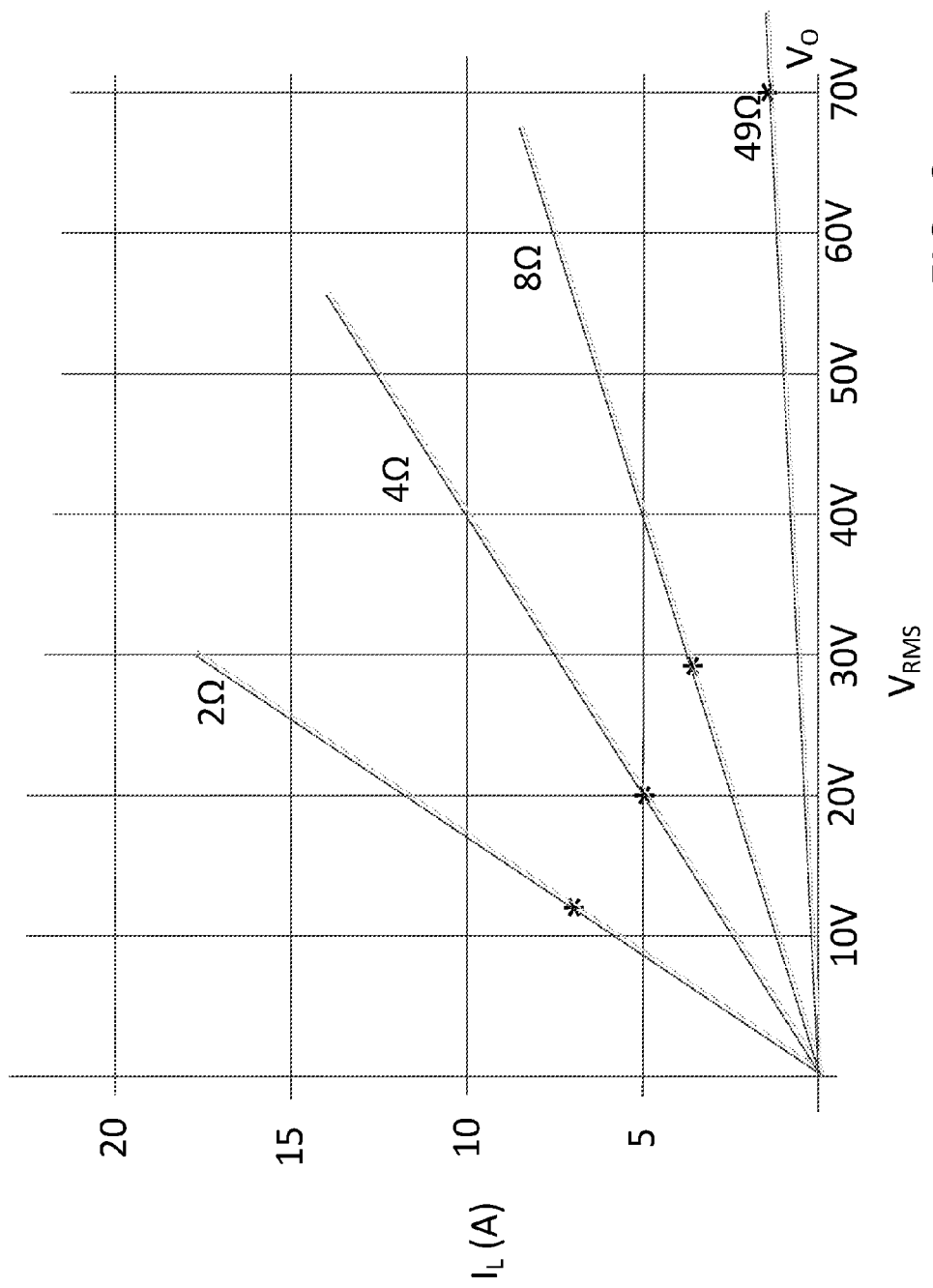

FIG. 6 is a chart of output current versus output voltage for a 200 W Class D amplifier according to an embodiment.

Figure 7:
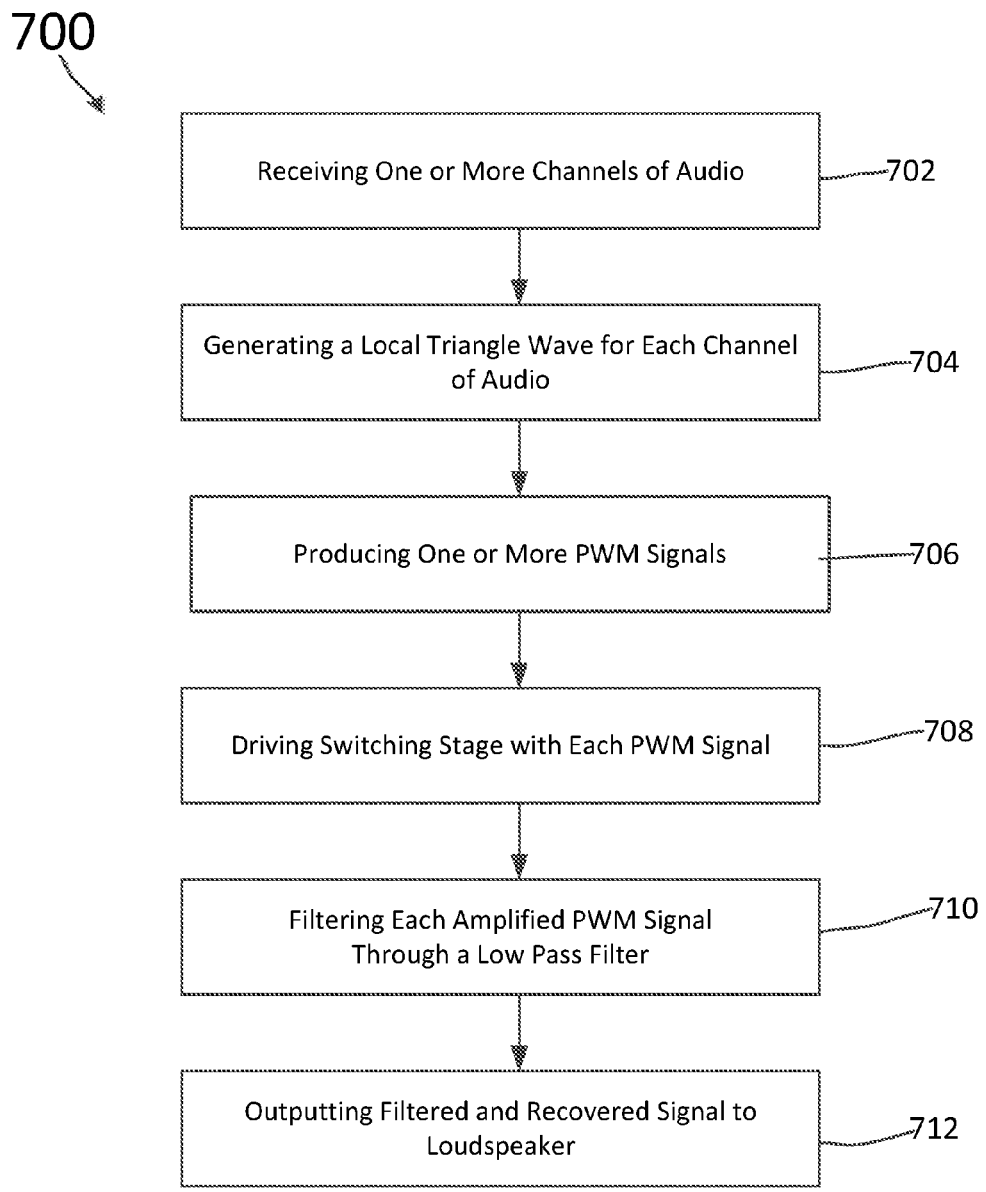

FIG. 7 is a flowchart illustrating steps to perform a method for operating a multi-channel Class D audio amplifier according to aspects of the embodiments, wherein crosstalk noise is substantially reduced or eliminated, and mismatching speaker loads with respect to output power is substantially prevented.

Figure 8A:
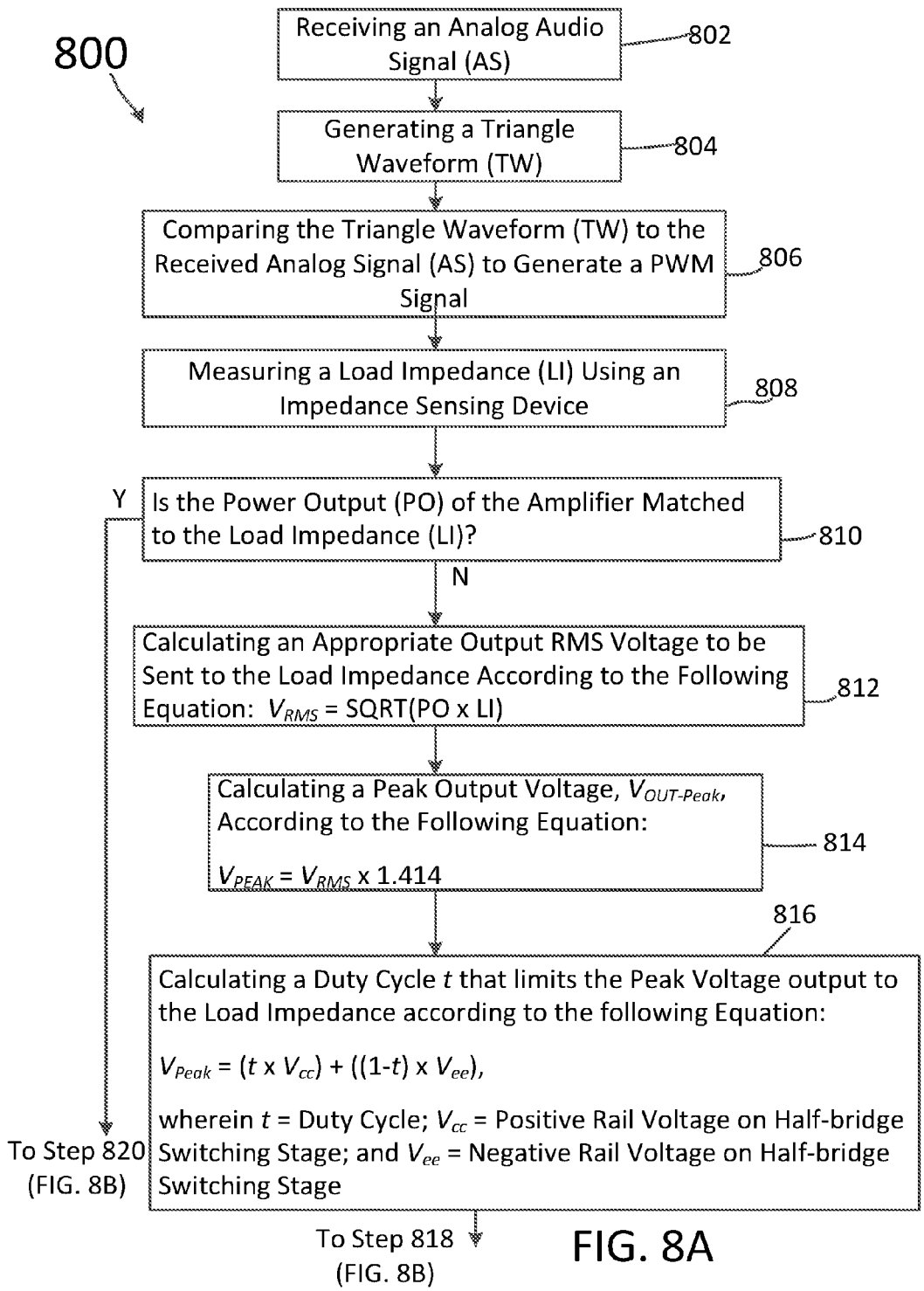
Figure 8B:
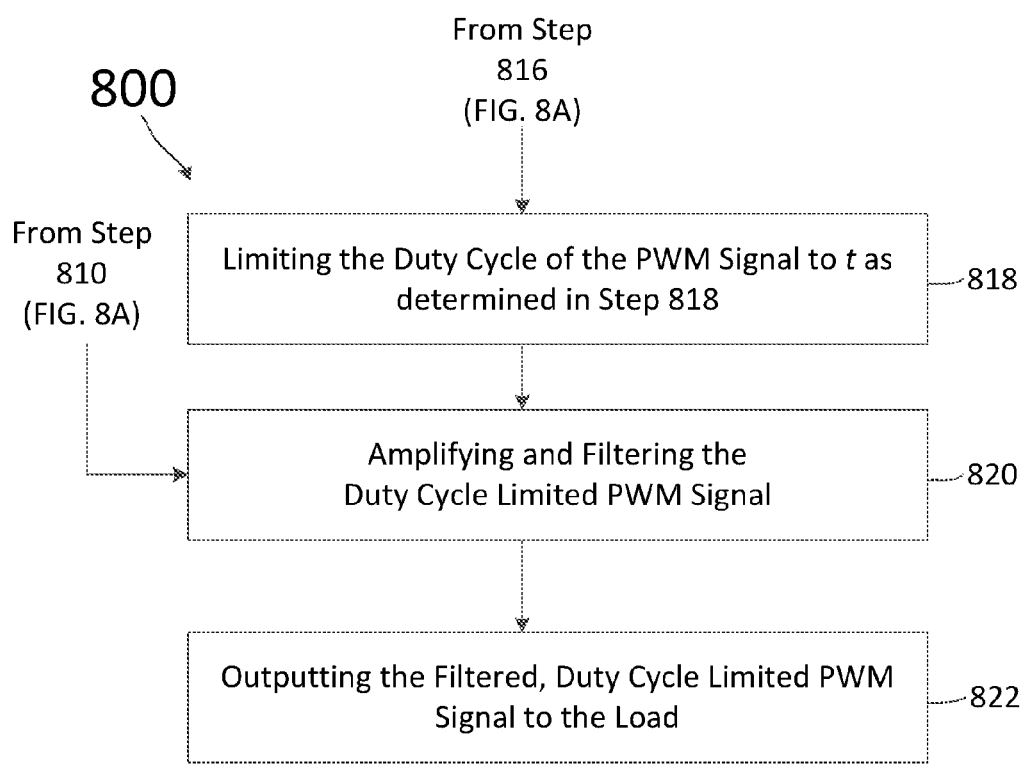

FIGS. 8A and 8B illustrate a flow chart of a method for delivering a duty cycle limited signal to a speaker load in an advanced Class D amplifier using a half-bridge switching output stage according to an embodiment.

DETAILED DESCRIPTION

List of Reference Numbers for the Major Elements in the Drawing

The following is a list of the major elements in the drawings in numerical order.

100 Typical Class D amplifier
102 Input Signal
103 Triangle Wave Generator
104 Pulse Width Modulator (PWM) Comparator
105 Triangle Wave Generator Output
106 Comparator Stage Output
108 Switching Output Stage
108' Half-bridge Transistor Switching Output Stage
109 Modulation Block
110 Switching Output Signal
112 Filter Stage
114 Amplified Output Signal
116 Speaker
300 Substantially Noise-free Triangle Waveform Generation Circuit
302 Digital Switching Frequency Control Circuit (Digital Clock)
303 Digital Clock Signal
304 DC Servo Circuit
306 Servo Circuit Capacitor
308 Servo Circuit Resistor
310 Servo Circuit Amplifier (Operational Amplifier (Op-Amp))
312 Triangle Waveform Generator Capacitor (Triangle Capacitor)
314 First Current Source
316 First Diode
318 Second Diode
320 First Current Sink
322 Low Noise Triangle Waveform Generator Output (Low Noise Triangle Waveform) Signal
350 Triangle Waveform Generator with Noise Immunity Circuit
400 Advanced Class D Amplifier (Advanced Amplifier)
404 Duty Cycle Limiting Signal Generator Circuit
406 Speaker Impedance Sensing Circuit
407 Low Noise Comparator Stage Output
407' Duty Cycle Limited Low Noise Comparator Stage Output
408 Manual Speaker Impedance Selection Switch
409 Low Noise Switching Output Signal
410 Duty Cycle Limiting Signal
412 Duty Cycle Limiting Modulation Block
413 Low Noise Amplified Output Signal
414 Current Sense/Measurement
416 Voltage Sense/Measurement
418 Duty Cycle Limiting Circuit
502 Receiver Inverter
504 Receiver Non-inverter
506 Transistor Switch (First and Second)

List of Acronyms Used in the Detailed Description of the Invention

The following is a list of the acronyms used in the specification in alphabetical order.

$A_{CL}$ Gain, Closed Loop
$A_{OL}$ Gain, Open Loop
dB Decibel
D Duty Cycle
DCL Duty Cycle Limiting
DC Direct Current
FPGA Field Programmable Gate Array
$I_P$ Current Peak
kHz Kilohertz
MOSFET Metal Oxide Semiconductor Field Effect Transistor
PCB Printed Circuit Board
PWM Pulse Width Modulation
RMS Root Mean Square
$V_I$ Input Voltage
$V_O$ Output Voltage
$V_P$ Voltage Peak
$V_{PP}$ Voltage Peak-to-Peak
$V_{tmax}$ Maximum Voltage of Low Noise Triangle Waveform 322
$V_{tmin}$ Minimum Voltage of Low Noise Triangle Waveform 322

The aspect of the embodiments disclose systems, devices and methods for reducing channel to channel crosstalk in a multi-channel Class D audio amplifier, and systems, devices and methods for duty cycle limiting to enabling safe operation regardless of load impedances connected to the multi-channel Class D audio amplifier. Individual triangle ramp generators in each audio channel with a single, fixed frequency digital clock for synchronization are employed. Additionally, the critical timing capacitor for each channel is connected directly to the ground reference of that channel. Accordingly, the isolation between channel grounds can be much higher relative to prior art audio amplifiers. The duty cycle can be limited by firmware and/or other means, and load sensing can be implemented to ensure safe operation.

FIG. 3 is a schematic diagram of a portion of a multi-channel Class D audio amplifier according to aspects of the embodiments. Shown in FIG. 3 is a portion of a Class D amplifier that can be used in place of triangle waveform generator 103 of FIG. 1. In FIG. 3 there is a single digital switching frequency control circuit (digital clock) 302 that provides a common digital clock signal to each of a plurality of triangle waveform generators 350 according to an embodiment. Though only one digital clock 302 is shown in FIG. 3, those of skill in the art can appreciate that two or more such digital clocks 302 can be used, and they can be "slaved" to each to ensure that each digital clock signal is lined up with the others. However, for purposes of this discussion, only one such digital clock 302 shall be referenced and referred to herein.

The timing/integrating (triangle) capacitors 312 for triangle ramp generator circuits 350 reside locally in each channel, and are referenced to the local ground for that channel. Accordingly, since triangle capacitors 312 are independent and referenced to each individual ground, they are not susceptible to crosstalk. It is known to those of skill in the art that any noise that is present on triangle capacitors 312 can adversely impact operation of any Class D amplifiers.

As shown in FIG. 3, there are several different channels of triangle waveform generator 350a-n. Each of the several different channels of triangle waveform generator 350a-n can implement aspects of the embodiments that can substantially reduce or eliminate noise in triangle waveform generator, and hence the amplified audio signal. A substantially noise free amplified audio signal is a cleaner output audio signal and thus provides a more faithful audio amplification and reproduction. Since one (or a plurality of slaved) digital clocks are used for each of triangle waveform generators 350a-n, each will operate at about or substantially the same clock frequency of the digital clock.

Operation of each of triangle generators 350a-n is as follows. Digital clock 302 has a frequency of $f_d$, according to an embodiment, about 384 kHz, and this is the same frequency of triangle wave generator 350a-n, $f_t$. Triangle capacitor 312 is the triangle wave timing capacitor, and any noise that might be present on triangle capacitor 312 will be present on triangle generator output, low noise triangle waveform signal 322. Thus, as can be appreciated by those of skill in the art, it is desirable to make this point in triangle waveform generator 350 as noise free as possible to prevent any such noise from propagating into the amplified audio signal.

As those of skill in the art can appreciate, digital clock 302 provides a digital clock signal that varies between a logic level one output ("high") and a logic level zero output ("low"), and this is input to second diode 318. When digital clock 302 output is high, first diode 316 is reverse biased in regards to digital clock 302 output, meaning that any noise that might be present on digital clock signal 303 cannot flow through it (because it is reverse biased). First current sink 320 is set to sink current at 2 I, and this is provided by digital clock 302, for each triangle waveform generator 350 that it is connected to. First current source 314, which is set to 1 I, provides current to triangle waveform generator capacitor (triangle capacitor) 312, which then charges up, causing triangle waveform to rise in a linear fashion.

According to an aspect of the embodiments, first diode 316 isolates the triangle waveform generator output, low noise triangle waveform signal 322 when digital clock 302 output signal is high because current cannot flow through first diode 316 when digital clock signal 303 output signal is a logic high. As noted above, each channel comprises first diode 316 and second diode 318, which are configured to isolate any noise or crosstalk that might be present on digital clock signal 303 from leaking into low noise triangle waveform signal 322, thereby making this signal substantially immune to crosstalk.

Triangle capacitor 312 continues to charge up while digital clock 302 output signal is high, but when it goes low, then second diode 318 is turned off, and first current sink 320 begins to sink current at a rate of 2 I. First current sink 320 obtains the 2 I current from both triangle capacitor 312, and from first current source 314, both of which provide about 1 I amount of current. When current is drained from triangle waveform generator capacitor 312, this causes the voltage across the capacitor to fall, which is the downward sloping portion of the triangle waveform.

As those of skill in the art can appreciate, the upward and downward slopes of the triangle waveform generator would be essentially equal if first current source 314 provided exactly 1 I, and if first current sink 320 would sink exactly 2 I. However, those of skill in the art can further appreciate that rarely, if ever, do analog circuits (or even digital circuits) approach equality in terms of sourcing/sinking voltages, currents, and the like. Consequently, error correction circuitry is purposely built into triangle waveform generator 350 according to an embodiment to counteract such "naturally occurring" error sources as discussed in the next section.

According to an aspect of the embodiments, DC servo circuit 304 serves to match the rising and falling voltage output of triangle waveform generator circuit 350 and to prevent a positive or negative DC voltage bias being formed on the output triangle waveform signal by compensating for purposely created current differences between first current source 314 and first current sink 320. That is, DC servo circuit 304 operates to maintain a balance between first current sink 320, which is designed to sink a current of about 2 I, and first current source 314, which is designed to source a current of slightly less than 1 I. The purposely created imbalance between the current source and sink must exceed the worst-case naturally occurring imbalance. Then, the DC servo circuit can be designed to source current only, as a way to maintain balance. The circuit topology used for generating this triangular ramp voltage allows great flexibility for improving crosstalk and noise performance. For example, increasing the peak-to-peak voltage swing of the triangular waveform generator will decrease the noise level of the amplifier, and its sensitivity to crosstalk-induced noise. Likewise, increasing the value of the triangle capacitor 312 will decrease noise sensitivity and crosstalk. The values of the 1 I and 2 I currents must be selected in conjunction with the value of triangle capacitor 312, and the switching frequency, in order to achieve the desired $V_{pp}$ voltage swing for the triangular ramp output waveform (low noise triangle waveform signal 322). As those of skill in the art can appreciate, other values of current sourcing and sinking can be used dependent upon the components used, desired accuracy, and other factors.

In accordance with an aspect of the embodiments, if the current sink level is set to 2 I and the current source level is set to less than 1 I, more current is being drained from triangle capacitor 312, on each half cycle of digital clock signal 303, than is being added to triangle capacitor 312 on each positive cycle of digital clock signal 303 and excess charge will be drawn from triangle capacitor 312; consequently, over subsequent cycles, low noise triangle waveform signal 322 begins to ride a gradually falling DC level (because of the current imbalance between first current source 314 (less than 1 I) and first current sink (2 I)). The ability of the DC servo circuit to correct this imbalance by sourcing additional current into triangle capacitor 312 allows low noise triangle waveform signal 322 to have a 0V DC level. In the absence of the DC servo circuit 310, a falling or rising DC level of low noise triangle waveform signal 322 can seriously and negatively impact the expected output duty cycle.

According to an aspect of the embodiments, therefore, DC servo circuit 304 (which is comprised of servo circuit amplifier 310, servo circuit capacitor 306, and servo circuit resistor 308), could be designed to only increase or only decrease the current sourced by current source 314 as needed to keep the rising and falling slopes of the triangular waveform similar, or it could be designed to both increase or decrease the current sourced by first current source 314.

Accordingly, therefore, assuming an implementation whereby DC servo circuit 304 can both increase or decrease the current sourced by first current source 314, DC servo circuit 304 monitors the DC level at its input (which is low noise triangle waveform signal 322) and if it begins to swing low, i.e., a negative DC bias forces or drives low noise triangle waveform signal 322 downward, DC servo circuit 304 compensates by causing additional current to be sourced by first current source 314 (which can be seen is a variable current source) so that triangle capacitor 312 is properly charged and maintains a DC level of about 0 volts. Conversely, and according to further embodiments, if DC servo circuit 304 determines that low noise triangle waveform signal 322 is beginning to swing positive, i.e., a positive DC voltage bias, DC servo circuit 304 compensates by causing less current to be generated from variable first current source 314 so that triangle capacitor 312 is properly charged and maintains a DC level of about 0 volts. In one embodiment of DC servo circuit 304, operational amplifier (op-amp) 310 is used as an integrator to compare the DC value of the triangular waveform to a 0V reference voltage. The op-amp will source or sink current as necessary in order to keep the average DC value of the triangular waveform equal to the 0V reference voltage. Those of skill in the art will recognize how to use an op-amp as an integrator to accomplish this circuit function.

In the embodiment shown in FIG. 3, the switched current sources (314, 320), which source or sink current to triangle capacitors 312, reside locally. Each channel comprises a first current source 314 and a first current sink 320. According to another aspect of the embodiments, switched current sources 314 and current sink 320 can be located in a single position on the PCB and operate as current mirrors from a central current generator circuit block. Each set of current mirrors will be dedicated to feeding an individual channel. Sending the ramp signal as a current instead of a voltage reduces voltage noise susceptibility, and also allows the ramp signal to be referenced to each individual channels ground reference, thus avoiding common impedances and ground loops.

Attention is now directed to a different aspect of operation of Class D amplifiers, the gain. All amplifiers have what is known as an open loop gain parameter; that is, $V_o/V_i=A_{OL}$. Typically, $A_{OL}$ is pretty large—sometimes 10,000 or even more. But, the open loop gain configuration of most amplifiers is non-linear, meaning that simply inputting a signal and expecting a linearly amplified output is hardly, if ever, realized. That is, the output is substantially distorted in terms of gain versus frequency and gain versus input amplitude, phase shift, and so on. Thus, it is the goal of circuit designers to linearize the gain of the amplifier such that the output is linearly related to the input in terms of gain versus frequency of the input signal, gain versus the amplitude of the input signal, and phase shift over the expected bandwidth, among other factors.

It is known by those of skill in the art that to obtain good linearization, what is typically done is to add negative feedback between the output and the input such that the gain of the amplifier is now properly characterized as a closed loop gain. It is also known that while negative feedback does provide the greatly needed linearization, it also reduces the gain from the very high numbers of the open loop condition (e.g., about 10,000, or even higher) to much lesser values in the closed loop configuration, $A_{CL}$, which can range from just above zero (a gain of 0.1 is an "amplifier" of less than unity, actually a signal-reducer or attenuator) to about 100 or even about 1000. The actual gain numbers are typically a product of values of passive components placed about the amplifier in specific configurations, as known to those of skill in the art.

Furthermore, it is recognized that when $A_{OL}$ is much larger than $A_{CL}$ ($A_{OL} \gg A_{CL}$), then the tolerance of the closed loop gain is controlled by the tolerances of the components that create the closed loop gain. The closed loop gain is typically determined by using simple resistors in a feedback loop. Therefore, very low tolerance resistors of 1% or even better can be used, and the tolerance of the closed loop gain can be controlled to within the same magnitude.

Based in part on the above discussion regarding open and closed loop gain, there are three types of gain control configurations that are typically used with Class D amplifiers. The first is the open loop gain. As discussed above, this is not typically used in Class D amplifiers, nor many others, because of its non-linearity's. The second type of gain control is a negative feedback loop closed loop system, wherein the feedback signal is taken before the output low pass filter. Referring again to FIG. 1, this point would be at point A. That is, a signal is fed-back from point A to an error amplifier (not shown in either of FIG. 1 or 4) that compares the feedback signal to the input signal 102. The output of the error amplifier is then input into PWM comparator 104, and this helps create a more linear output signal. As those of skill in the art can appreciate, this is relatively easy to accomplish as precludes the additional phase shift of the L-C filter (typically used as filter stage 112). That is, the output signal has not been fed through the (typically) inductor-capacitor (L-C) low pass filter (filter stage 112), which does impart significant (and difficult to control) phase shift over the audio frequency bandwidth. In comparison, the third type of closed loop gain control provides a negative feedback signal from after filter stage 112, i.e., from point B. That is, a signal is fed-back from point B to an error amplifier (not shown in either of FIG. 1 or 4) that compares the feedback signal to the input signal 102. The output of the error amplifier is then input to PWM comparator 104. As mentioned above, the output signal is substantially more difficult to control as a negative feedback signal because of the significant phase shift caused by the inductor/capacitor low pass filter combination. However, the post-filter negative feedback closed loop gain control configuration provides a more linear output signal. This is more difficult to implement because the gain must be controlled in terms of the different phase shifts that occur through use of the inductor and capacitor in the output low pass filter. However, greater linearity can be achieved in this configuration, but stability is an issue because of the phase shifts.

Regardless of the type of gain control that is employed, the peak-to-peak ramp voltage has an effect on the open loop gain. By increasing the ramp voltage, the noise immunity of the Class D amplifier can be improved according to an embodiment. As discussed previously, the open loop gain of the modulator block of the amplifier is the ratio of the power supply DC rail voltage to the peak-to-peak ramp voltage. So, increasing the peak-to-peak ramp voltage lowers the gain of the modulator, and also its noise sensitivity. As those of skill in the art can appreciate, presuming a fixed frequency of low noise triangle waveform signal 322, the peak-to-peak voltage of low noise triangle waveform signal 322 is determined by a combination of the value of triangle capacitor 312, and the current source/sink levels (first current source 314, first current sink 320). Further, the power rail voltages, $V_{cc}$ and $V_{ee}$ limit the maximum amount of the output voltage. It further can be appreciated by those of skill in the art that the high logic level of digital clock waveform 303 must be greater than the positive peak value of low noise triangle waveform signal 322, and the low logic level of digital clock waveform 303 must be more negative than the negative peak value of low noise triangle waveform signal 322.

The ramp generator circuitry disclosed in FIG. 3 allows great flexibility in setting peak-to-peak ramp voltage. This can be done on a channel-by-channel basis, if desired, in a multi-channel amplifier. This could prove advantageous in a multichannel amplifier where different channels are designed for different, specific purposes. For example, in a surround-sound amplifier, one channel may be dedicated as a subwoofer driver, with different gain and frequency response requirements. In another application, a multichannel Class-D amplifier might be used inside a powered loudspeaker, where separate amplifier channels are used to drive the different loudspeaker drivers within the speaker cabinet. For example, one channel might drive the woofer, a second channel the midrange driver, and a third channel, the tweeter or super-tweeter. These different driver types have very different frequency response, impedance, power handling and sensitivity requirements. These different drivers could substantially benefit by being driven by an amplifier channel whose gain, frequency response, phase shift and noise sensitivity have been optimized for the specific driver. This is possible using the techniques disclosed according to the aspects of the embodiments described herein.

Attention is now directed to a different aspect of the embodiments described herein. If low noise triangle waveform signal 322 has an output voltage that ranges from +5V to −5V, then the gain of the modulator block of this amplifier is equal to the ratio of the power supply DC rail voltages to the peak-to-peak ramp voltage ($10V_{PP}$). As those of skill in the art can appreciate, this ratio describes the gain of modulator block 109 only. Modulator block 109 is just one of the gain blocks used to determine the open-loop gain of a Class D amplifier. The other blocks that are involved are: the output LC filter (which has unity gain up to its cutoff frequency (which is typically about 50 KHz); shown as filter stage 112 in FIG. 1); the output voltage divider (typically configured as a resistive divider from the output voltage node (point B, or signal 114 in FIG. 1) to the error amplifier input; not shown in FIG. 1); and the error amplifier itself (also not shown in FIG. 1) which is another circuit block. The error amplifier compares the divided down output voltage to the input voltage. It is configured as an integrator, so that it has very high gain at low frequencies, with decreasing gain as frequency increases. As those of skill in the art can therefore appreciate, it is possible for the closed loop gain of the Class D amplifier (with all these circuit blocks connected in series), to have an open-loop gain of about 10,000 at 20 Hz, and an open loop gain of about 10 (20 dB) at 20 KHz.

When this $10V_{PP}$ signal is input to a switching amplifier, for example, switching output stage 108 (which is part of modulator block 109), whose output voltage swings between +/−50 volts, then the total open loop gain of modulator block 109 is 10, according to Equation (1):

$$A_{OL} = \frac{V_o}{V_i} = \frac{100V_{PP}}{10V_{PP}} = 10. \tag{1}$$

Problems can occur, however, when there is a mismatch between the output impedance of the load and the rated power output of the amplifier. For example, if the amplifier is configured to deliver 100 watts at $100V_{PEAK}$ ($200V_{pp}$) with a 49Ω speaker, and the 49Ω speaker is replaced with a 4Ω speaker, then the switching amplifier will be driven into over current situations that will either activate overcurrent protection circuits, or destroy the output transistor(s), as those of skill in the art can appreciate.

There are several conventional methods for dealing with this problem. For example, a switch can be implemented on the panel where the speakers are connected to the Class D amplifier, and the user is required to put the switch in the correct position that corresponds to the load of the connected speaker. The switch then connects an appropriate output voltage from a multi-tapped transformer or multi-output DC power supply, to the switching amplifier, i.e., the DC voltage "rails." While many users will correctly move the switch as appropriate, this solution requires the implementation of the multi-tapped transformer or multi-output DC power supply, and all the additional wiring that that entails.

According to further aspects of the embodiments, limiting the duty cycle of the signal output from the modulation stage will limit the average power output to the speakers, and thus can avoid or substantially avoid over-current situations with the output transistor(s). According to aspects of the embodiments, by limiting the duty cycle of the signal output from the modulation stage, the need for changing the DC voltage rails can be avoided. According to further aspects of the embodiments, a switch can also be used to convey to the appropriate circuitry what the correct (or maximum) duty cycle that can be used with the speakers that have been connected to the Class D amplifier. According to further aspects of the embodiments, a remote sensing mechanism can also be implemented that precludes the use of the switch according to correctly set the appropriate duty cycle limit. According to an embodiment, a field programmable gate array (FPGA) can be used, among other devices (e.g., a digital signal processor (DSP)), to limit the output duty cycle. Since the switching frequency is fixed and developed by the internal dividers in the FPGA, it is simple for the FPGA to limit the duty cycle to be a fraction of the switching period. This can be accomplished by counting cycles of a higher frequency clock that the switching frequency is derived from. Use of the FPGA and DSP for limiting the duty cycle of low noise comparator stage output 407 are discussed in greater detail below The following example calculations illustrate how the duty cycle can affect the maximum output average power to speakers 116. In this example, the Class D amplifier has DC voltage rails of +/−100 volts, or $200V_{PP}$. While the duty cycle can range between 0 and 100%, on average it will be about 50%, or duty cycle (D) equals 0.5. The RMS value of a sine waveform is related to the peak voltage according to the following:

$$V_{RMS} = \frac{V_{peak}}{\sqrt{2}}, \quad (2)$$

or $$V_{rms} = \frac{100}{\sqrt{2}} \approx 70 V_{RMS}.$$

In one typical application a 49Ω speaker is used, and the Class D amplifier is specified to provide about 100 watts (RMS). Then, $$P = VI \text{(all RMS)} \quad (3), \text{ or}$$

$100W_{RMS} = 70V_{RMS} \times I_{RMS}$ or, $I_{RMS} = 1.42 A_{RMS}$.

If, however, a 4Ω speaker is hooked up by mistake to the Class D amplifier that is capable of delivering 100 Watts, then the output current can spike to about 25 $A_{PP}$.

$$I_{Peak} = \frac{V_{peak}}{r} \quad (4)$$

$$I_{Peak} = \frac{100 A_{Peak}}{4} = 25 A_{Peak}.$$

This yields an RMS value of—

$I_{RMS} = 25 A_{Peak} \times \sqrt{0.5} = 17.6 A_{RMS}$.

Thus, switching a 4Ω speaker for a 49Ω speaker can lead to a significant over-current situation (from 1.42 $A_{RMS}$ to 17.6 $A_{RMS}$). A current of this magnitude will typically far exceed the current ratings of the output driver transistors of a 100 W amplifier, and thus will, over time, damage them, or at least trigger overcurrent protection, leading to significantly degraded audio performance.

Considering, therefore, that the output voltage is $100V_{Peak}$, and the load is only 4 ohms, the peak current is 25 A (with an RMS value of 17.6 $A_{RMS}$, the output power (RMS) would be—

$$P_{RMS} = i^2 \times r = 17.6^2 \times 4 \approx 1225 \text{ watts}_{rms} \quad (5).$$

According to an aspect of the embodiments, the goal is to limit the RMS power through the 4Ω speaker to about 100 watts (or whatever is the maximum output power of the Class D amplifier) by limiting the duty cycle D of the modulation stage to an appropriate value. The RMS value of the output voltage is determined as follows:

$$P_{RMS} = 100 W_{RMS} = \frac{V_{RMS}^2}{r}, \quad (6)$$

or, $$V_{RMS} = \sqrt{100 W_{RMS} \times 4} = 20 V_{RMS}.$$

Knowing the desired RMS value of the output voltage from the modulation stage to produce a maximum allowed power, Equation (2) can then be used to determine the peak value of the output voltage, according to the following:

$$V_{Peak} = V_{RMS} \times \sqrt{2}$$

which yields, $$V_{Peak} = 20 V_{RMS} \times 1.414 = 28.28 V_{Peak} = 56.56 V_{PP} \quad (7).$$

Knowing the peak voltage required from the output of switching output stage 108, the appropriate duty cycle can be determined, according to the specific type of transistor switching circuit being used therein. According to an embodiment, and referring to FIG. 5, a half-bridge transistor switching output stage 108' is shown, operation of which is known to those of skill in the art. Half-bridge transistor switching output stage 108' includes receiver inverter 502, receiver non-inverter 504, and first and second switching transistors 506a,b (shown in simplified block diagram form of simple switches), which are driven by the outputs of receiver inverter 502 and receiver non-inverter 504 as shown. Through operation of the two receivers 502, 504, and switches 506a,b, a pulsed output, low noise switching output 409, is provided to filter stage 112, and then speaker(s) 116. The period of low noise switching output 409 is the same as low noise triangle waveform signal 322 if generated by triangle waveform generation circuit 300 according to an embodiment, and the duty cycle D is the ratio of on-time, t, to the total period T (which is equal to the reciprocal of the frequency of low noise triangle waveform signal 322). Operation of half-bridge transistor switching output stage 108' is known to those of skill in the art. That is—

$$D = \frac{t}{T}. \quad (8)$$

The voltage output of filter stage 112 can be described according to the following expression:

$$V_{Out\text{-}Peak} = (t)(V_{cc}) + (1-t)(V_{ee}), \quad (9).$$

Using the values of $V_{cc}$ equal to +100V and $V_{ee}$ equal to −100V, and using the desired $V_{RMS}$ voltage of 20V (based on the peak output voltage $V_{Peak}$ equal to 28.28V; see, Expression (7) above), then Expression (9) becomes—

$$28.28 V_{Out\text{-}Peak} = (t)(100) + (1-t)(-100),$$

and from this the duty cycle t can be determined as—

$$t = 64.14\%.$$

Therefore, with a 100 watt maximum output Class D amplifier ostensibly designed to provide 100 watts into a 49Ω speaker load, by limiting the duty cycle D of the modulation stage to about 64%, the RMS value of the voltage will be limited to about $20V_{RMS}$, and the power through the 4Ω speaker will be limited to about 100 W. As those of skill in the art can now appreciate, for different values of speaker load and/or output power of the Class D amplifier, the duty cycle would change accordingly.

FIG. 4 illustrates a schematic block diagram of advanced Class D amplifier (advanced amplifier) 400 according to an embodiment. Advanced amplifier 400 implements the different aspects of the embodiments for noise suppression and immunity and duty cycle limitation as described above, and below in regard to method 700 described in regard to FIG. 7. According to embodiments, advanced amplifier 400 includes PWM comparator 104, duty cycle limiting (DCL) circuit 418, switching output stage 108, filter stage 112, noise immune triangle waveform generator 300, speaker load resistance sense circuit 406 (or manual speaker load selection switch 408), and duty cycle limiting-signal generator circuit 404. In fulfillment of the dual purposes of clarity and brevity, switching output stage 108 and filter stage 112 need not be discussed again as their design and use within amplifier 400 according to an embodiment has not changed from the discussion made previously in regard to FIGS. 1 and 5, discussed above.

The output of duty cycle limiting-signal generator circuit 404 is duty cycle limiting signal 410. Duty cycle limiting signal 410 is used by DCL 418 to limit the duty cycle of low noise comparator stage output signal 407 according to an embodiment. Generation of duty cycle limiting signal 410 is based on inputs received from speaker impedance sensing circuit 406, or manual speaker impedance setting switch 408 according to an embodiment. Duty cycle limiting signal generator circuit 404 can be comprised of hardware alone, an implementation of software within a processor alone, or a combination thereof according to further embodiments. Such implementations of circuit functionality are known to those of skill in the art.

Speaker impedance sensing circuit (impedance sensing circuit) 406 operates in the following manner. According to embodiments, impedance sensing circuit 406 simultaneously senses or measures output voltage and output current. The output voltage can be measured using known voltage measurement techniques and devices, and the output current can similarly be measured or sensed using known current measurement or sensing techniques and devices (which can include Hall effect current sensing devices, current transformer sensing/measurement devices, and/or precision low value resistors). As can be appreciated by those of skill in the art, with these two inputs alone, processing circuits (including analog-to-digital converters) in impedance sensing circuit 406 can determine (i.e., calculate) the impedance of the attached speaker load, speaker(s) 116. Manual speaker impedance selection switch can be a multi-pole switch, or multi-position selection switch that outputs a digital signal that represents the user's selection of speaker impedance, or a DC voltage signal of varying amplitude based on the user's selection of the speaker impedance.

According to an aspect of the embodiments, duty cycle limiting signal generator circuit 404 can accept either type of speaker impedance determination signals and use either to create duty cycle limiting signal 410, along with one or more indication signals of the maximum output power of advanced amplifier 400 and the speaker impedance selected, in accordance with the discussion above.

Once duty cycle limiting signal generator circuit 404 has generated duty cycle limiting signal 410, which can generally be in the form of a digital signal, DCL circuit 418 accepts it as an input and uses it to limit the output duty cycle of low noise comparator stage output signal 407 according to an embodiment. According to a further embodiment, DCL circuit 418 can be in the form of an FPGA, or digital signal processing (DSP) circuit. If DCL 418 is in the form of an FPGA, the FPGA can limit the duty cycle based on generated duty cycle limiting signal 410. If the duty cycle of low noise comparator stage output signal 407 did not need to be restricted (because the load impedance of speakers 116 matched the output power of advanced class D amplifier 400), then no restriction on the duty cycle would be placed by DCL circuit 418. That is, low noise comparator stage output signal 407 from PWM comparator 104 would propagate through the FPGA (DCL 418) as transparent logic, with its "normal" 0% to 100% duty cycle range. In this case, the output of DCL 418 would be low noise comparator stage output signal 407. If, however a particular duty cycle limit is activated, then the FPGA, using known programming techniques, can prematurely end or terminate any pulse from PWM comparator 104 that exceeds the selected duty cycle limit. In this case, the output of DCL 418 would be duty cycle limited low noise comparator stage output signal 407'. A substantially similar mechanism can occur if instead of an FPGA a digital signal processor (DSP) were used for DCL circuit 418. Use of, and programming thereof, of DSPs is known to those of skill in the art.

According to embodiments, the DSP acting as DCL circuit 418 could accept as an input the digital signal output from DCL signal generator circuit 404, duty cycle limiting signal 410, and using one or more pre-stored graphs as shown in FIG. 6, determine the impedance of speaker(s) 116. For example, if the current and voltage measured by impedance sensing circuit 406 equal to 6.25 A and 50 $V_{RMS}$, which is then provided in digital form to DCL circuit 418, DCL circuit 418 could then refer to the graph of FIG. 6, and determine that an 8Ω speaker (50V/6.25 A=8Ω) is connected, and limit the duty cycle of low noise comparator stage output signal 407 accordingly, based on the other parameters, as discussed above. It should be noted, however, that FIG. 6 has been created for a 200 W Class D amplifier.

FIG. 6 illustrates several data points, one for each of a 2Ω load line, 4Ω load line, 8Ω load line, and a 70V load line (presuming the load impedance is 49Ω). As known to those of skill in the art, 70 VRMS is used for long speaker wire runs, such as in large buildings, or auditoriums, wherein the loss of power over extended wire runs is of concern. By boosting the voltage through a transformer to step up the signal voltage to about 70 VRMS, and then stepping it down at the speaker, less current needs to be sent through the lines, which could be several hundred if not thousands of feet in length. These speaker configurations are known to those of skill in the art.

As those of skill in the art can appreciate, impedance sensing circuit 406, DCL signal generator circuit 404 and DCL circuit 418, can all be combined into one circuit package, or two circuits, or even more than the three as shown in FIG. 4, and still be considered within the scope of the aspects of the embodiments. For example, it is known to those of skill in the art that DSPs and other circuits (such as FPGAs) can include analog-to-digital converters and other circuitry, including logic and memory (which can include many different types, including, but not limited to programmable read only memory, random access memory, flash drive memory, hard drives, floppy drives, among others), which can be used to store the information that correlates or determines impedance of speaker(s) 116 to a desired duty cycle (especially as that based on the information shown in the graph of FIG. 6, or other such substantially similar graphs). Furthermore, it should be apparent to those of skill in the art that an actual "graph" need not be stored in either or both FPGA or the DSP acting as DCL 418, but instead the corresponding data would be stored in the form of a table, or database, wherein the current and voltage values determined by impedance sensing circuit 406 act as inputs to determine the correct load impedance which can then be used to determine the correct duty cycle as described above in the one or more equations/expressions.

According to an embodiment, as discussed above in regard to FIG. 3, low noise triangle waveform signal 322 is generated according to operation of the devices shown therein, and this includes digital clock signal 303 as generated by digital switching frequency control 302, DC servo circuit 304, first and second diodes 316, 318, triangle capacitor 312, first current source 314, and first current sink 320. Together, these devices comprise noise immune triangle waveform generator circuit 300 according to an embodiment. The signal output from triangle waveform generator circuit 300, low noise triangle waveform signal 322, is input to PWM comparator 104 according to an embodiment. As such, low noise triangle waveform signal 322 operates substantially similarly to other triangle waveform signals, but because of the aspects of the embodiments described above, can be substantially noise free, or immune from noise generated by different aspects of operating a triangle waveform generator.

FIG. 7 is a flowchart illustrating steps to perform method 700 for operating advanced multi-channel Class D audio amplifier 400 according to aspects of the embodiments, wherein crosstalk noise is substantially reduced or eliminated, and mismatching speaker loads with respect to output power is substantially prevented.

In step 702, advanced amplifier 400 receives one or more channels of audio. In step 704, for each channel of audio, a local triangle wave is generated, low noise triangle waveform signal 322. A global digital clock (digital switching frequency control 302) outputting a fixed frequency clock signal (digital clock signal 303), such as 384 kHz clock signal, can provide a synchronized signal to each local triangle wave generator 350. According to an aspect of the embodiments, each channel of audio receives low noise triangle waveform signal 322 that is generated by noise-free triangle waveform generator circuit 300 that comprises one or more diodes 316, 318 to isolate the digital clock. According to an aspect of the embodiments, each channel of audio receives low noise triangle waveform signal 322 that is generated by noise-free triangle waveform generator circuit 300 that comprises DC servo circuit 340 that substantially maintains a symmetrical low noise triangle waveform signal 322 with substantially zero DC offset. According to a further aspect of the embodiments, each channel of audio receives low noise triangle waveform signal 322 that is generated by noise-free triangle waveform generator circuit 300 that further comprises a means for increasing a peak-to-peak amplitude of low noise triangle waveform signal 322. Each of these aforementioned aspects of the embodiments provides additional noise immunity for each of the channels of audio.

Following step 704, in step 706, method 700 generates one or more PWM signals from a comparison of a channel of audio with low noise triangle waveform signal 322 using PWM comparator 104. As those of skill in the art can appreciate, the duty cycle of the signal output from PWM comparator 104, low noise comparator stage output 407/407', need not have its duty cycle limited in any manner. However, according to aspects of the embodiments, the duty cycle of the signal is directly proportional with the amplitude of the audio signal but can be constrained according to the duty cycle limiting discussions provided above.

Method 700 then proceeds to step 708, wherein the one or more PWM signals drive switching output stage 108 to produce one or more amplified PWM signals, low noise switching output signal 409. Then, in step 710, the one or more amplified PWM signals, low noise switching output signal 409 are filtered through substantially lossless low pass filter stage 112 to remove the high frequency components of low noise switching output signal 409 and recover the audio signal which is now amplified. The amplified, filtered, output signal, low noise amplified output signal 413, is then sent to speaker 116.

FIG. 8 illustrates a flow chart of method 800 for delivering a duty cycle limited signal to a speaker load in advanced Class D amplifier 400 using a half-bridge switching output stage according to an embodiment.

Method 800 begins with step 802 in which an analog signal is received by advanced Class D amplifier. In step 804, low noise triangle wave signal 322 is generated, as described above in reference to FIG. 3. According to an embodiment, triangle waveform signal 105 can also be used instead of low noise triangle waveform signal 322. In step 806, method 800 compares low noise triangle waveform signal 322 (or triangle waveform 105; from herein on, in fulfillment of the dual purposes of clarity and brevity, discussion shall be limited to the low noise embodiment as described in reference to FIG. 3, although, as one of skill in the art can appreciate, aspects of the embodiments directed to limiting the duty cycle of the half-bridge switching output signal can be used with conventionally generated signals as well) to the received analog signal to generate a pulse width modulator comparator output signal, low noise comparator stage output signal 407.

In method step 808, method 800 measures a load impedance of speaker(s) 116 using impedance sensing circuit 406 according to an embodiment. In method step 810, the output of impedance sensing circuit 406 is used to determine whether the rated power output of advanced Class D amplifier 400 is appropriately matched to the load impedance of speaker(s) 116. That is, method 800 determines whether too much current/power will be generated, or attempted to be generated by advanced Class D amplifier 400 If the load impedance of speakers 116 is mismatched to the rated output power. As described above, the over-power/over-current situation generally occurs when the load impedance of speakers 116 is less than a predetermined value determined in view of the maximum output voltage and maximum current values output from advanced Class D amplifier 400. As described above in reference to FIGS. 4-7, such a situation can lead to damage of the half-bridge switching transistors, or current limiting techniques can occur, either or both of which can happen and cause poor audio quality.

If the measured load impedance of speaker(s) 116 is matched to the rated power output of advanced Class D amplifier 400 (i.e., the load impedance is too low for the present duty cycle selection (which can be no selection, meaning 0% to 100% duty cycle is permissible); "Yes" path from decision step 810), then method 800 proceeds to step 820, wherein the signal is filtered through substantially lossless low pass filter stage 112, and in step 822 the filtered signal is output to speaker(s) 116.

If, however, the load impedance of speaker(s) 116 is not matched to the rated power output of advanced Class D amplifier 400 ("No" path from decision step 810), then method 800 proceeds to method step 812. In step 812, method 800 calculates an appropriate output RMS voltage to be sent to speaker(s) 116 according to the following equation:

$$V_{RMS} = SQRT(PO \times LI).$$

Then, in method step 814, method 800 uses Equation (2) from above to determine peak output voltage:

$$V_{PEAK} = V_{RMS} \times 1.414$$

From the determined peak output voltage (being sent to speaker(s) 116), method 800, in method step 816, can use Equation 9 from above to calculate duty cycle t that limits the peak voltage output to match the load impedance and rated output power of advanced Class D amplifier 400 according to the following equation:

$$V_{Peak} = (t \times V_{cc}) + (1-t)(V_{ee}), \text{ wherein}$$

t=Duty Cycle;
$V_{cc}$=Positive Rail Voltage on Half-bridge Switching Stage; and
$V_{ee}$=Negative Rail Voltage on Half-bridge Switching Stage.

In method step 818 method 800 uses the calculated duty cycle t to limit the duty cycle of low noise comparator stage output signal 407 to create duty cycle limited low noise comparator stage output signal 407', as described above in reference to FIGS. 4-7, and especially in regard to circuit elements 404, 406, and 418. Then, in method step 820, method 800 filters duty cycle limited low noise comparator stage output signal 407', and the filtered, duty cycle limited signal is output to speaker(s) 116 in method step 822.

The disclosed embodiments provide a system, method, and mode for operating an advanced Class D amplifier 400 according to aspects of the embodiments, wherein crosstalk noise is substantially reduced or eliminated, and mismatching speaker loads with respect to output power is substantially prevented. It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

INDUSTRIAL APPLICABILITY

To solve the aforementioned problems, aspects of the embodiments provide a unique device in which a substantially noise free triangle waveform signal is generated for use in one or more audio channels of a Class D amplifier, and additional circuitry is further provided to substantially minimize of prevent the possibility of mismatching an output load impedance with regard to a rated power output of the Class D amplifier, thereby substantially prevent or minimizing the possibility of damaging the output stages of the Class D amplifier.

ALTERNATE EMBODIMENTS

Alternate embodiments may be devised without departing from the spirit or the scope of the invention. For example, the switched current sources which source or sink current to the timing capacitors may be located in a single position on the PCB of the audio amplifier and operate as current mirrors from a central current generator circuit block.

What is claimed is:
1. A method for delivering a duty cycle limited signal to a speaker load in a Class D amplifier using a half-bridge switching output stage, the method comprising:
   (a) receiving an analog audio signal;
   (b) generating a triangle waveform;
   (c) comparing the triangle waveform to the received analog signal to generate a pulse width modulated signal;
   (d) measuring a load impedance (LI) of the speaker load; and
   (e) determining whether a power output (PO) rating of the Class D amplifier matches that of the LI of the speaker load, and
      if the PO rating matches the LI, amplifying the pulse width modulated (PWM) signal, filtering the amplified pulse width modulated signal, and outputting the filtered, amplified pulse width modulated signal to the speaker load, and
      if the PO rating does not match the LI, calculating a duty cycle limitation t that limits the peak output voltage to the load impedance such that a new power output rating of the output signal matches the load impedance, and limiting the duty cycle of the PWM signal according to the calculated duty cycle limitation t.

2. The method according to claim 1, wherein the step of measuring a load impedance of the speaker load comprises:
   measuring an output current to the speaker load, $I_{OSL}$;
   measuring the output voltage to the speaker load, $V_{OSL}$; and
   calculating the load impedance (LI) based on the ratio of the measured output voltage to the measured output current, according to the expression—

$$LI = \frac{V_{OSL}}{I_{OSL}}.$$

3. The method according to claim 1, wherein the step of calculating a duty cycle limitation t comprises:
   calculating an appropriate output root mean square (RMS) voltage $V_{RMS}$ to be output to the load impedance according to the expression—

$$V_{RMS} = (PO \times LI)^{1/2};$$

calculating a peak output voltage $V_{Out-Peak}$ according to the expression—

$$V_{Out-Peak} = V_{RMS} \times 1.414; \text{ and}$$

calculating the duty cycle limitation t to limit the peak output voltage $V_{Out-Peak}$ to the load impedance according to the expression—

$$V_{Out-Peak} = (t \times V_{cc}) + ((1-t) \times V_{ee}),$$ wherein $V_{cc}$ equals a positive rail voltage on a half-bridge switching stage that is part of the Class D amplifier, $V_{ee}$ equals a negative rail voltage on the half-bridge switching stage, and t equals a duty cycle limitation as a number between 0 and 1.

4. The method according to claim 3, further comprising:
limiting the duty cycle of the PWM signal according to the calculated duty cycle limitation t;
amplifying the duty cycle limited PWM signal;
filtering the duty cycle limited PWM signal; and
outputting the filtered, duty cycle limited PWM signal to the speaker load.

5. The method according to claim 4, wherein the step of limiting the duty cycle of the PWM signal comprises:
measuring a time period of a positive voltage transition of the PWM signal, and limiting the time period of the positive voltage state such that it does not exceed the calculated duty cycle limitation t.

6. The method according to claim 5, wherein the step of limiting the time period of the positive voltage transition of the PWM signal comprises:
limiting the time period of the positive voltage state of the PWM signal through use of at least one of a digital signal processor (DSP), microprocessor, and field programmable gate array (FPGA).

7. The method according to claim 1, wherein the step of determining whether a power output (PO) rating of the Class D amplifier matches that of the load impedance (LI) comprises:
calculating a load impedance $LI_{calc}$ based on a maximum output voltage $V_{out-max}$ and maximum output current $I_{out-max}$ of the class D amplifier according to the following expression—

$$LI_{calc} = \frac{V_{out-max}}{I_{out-max}},$$

and determining whether the measured LI is greater than or equal to the calculated load impedance, $LI_{calc}$.

* * * * *